United States Patent [19]

Awata et al.

[11] Patent Number: 5,144,572
[45] Date of Patent: Sep. 1, 1992

[54] DIGITAL FILTER FOR FILTERING IMAGE DATA

[75] Inventors: Yoshinori Awata; Noriaki Tsuchiya, both of Kanagawa, Japan

[73] Assignee: Fuji Xerox Co., Ltd., Tokyo, Japan

[21] Appl. No.: 588,035

[22] Filed: Sep. 25, 1990

[30] Foreign Application Priority Data

Oct. 2, 1989 [JP] Japan .................. 1-257372

[51] Int. Cl.$^5$ .............................................. G06F 15/31
[52] U.S. Cl. ................................................ 364/724.05
[58] Field of Search ................ 364/724.01, 724.05; 382/54

[56] References Cited

U.S. PATENT DOCUMENTS 4,947,446 8/1990 Jutand et al. ................... 364/724.05

FOREIGN PATENT DOCUMENTS 63-50101 3/1988 Japan .
63-95345 4/1988 Japan .

Primary Examiner—Long T. Nguyen
Attorney, Agent, or Firm—Finnegan, Henderson, Farabow, Garrett and Dunner

[57] ABSTRACT

A digital filter capable of obtaining a filter output by adding the products of image data in a filter operation area with a set of desired filter constants, selecting a predetermined portion among the calculated bits with an output bit selection circuit, and expressing the result retrieved according to the decimal point format of the filter constants. According to the digital filter described above, different types of filter operations such as a low-pass filter operation and a high-pass filter operation can be performed accurately.

3 Claims, 8 Drawing Sheets

FIG. 6(A)
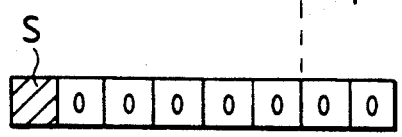
FIG. 6(B)
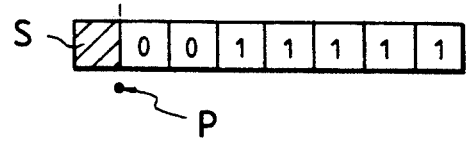
FIG. 6(C)
FIG. 7(A)
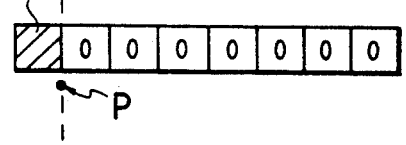
FIG. 7(B)
FIG. 7(C)
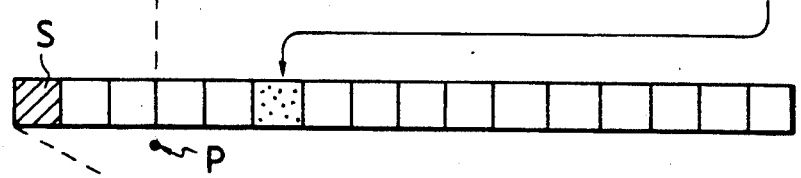
FIG. 7(D)
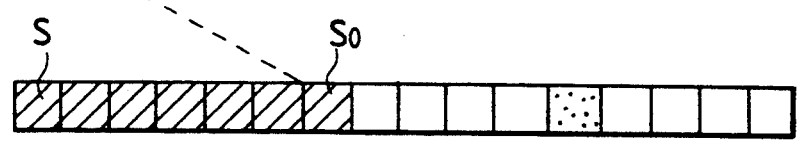
FIG. 7(E)

FIG. 8

|   | 5 TAPS |   |   |   |
|---|---|---|---|---|
| a | b | c | b | a |
| b | d | e | d | b |
| c | e | f | e | c |
| b | d | e | d | b |
| a | b | c | b | a |

5 LINES

FIG. 9

| | | | | | |
|---|---|---|---|---|---|
| 1st LINE | $I_{11}$ | $I_{12}$ | $I_{13}$ | $I_{14}$ | $I_{15}$ |
| | $I_{21}$ | $I_{22}$ | $I_{23}$ | $I_{24}$ | $I_{25}$ |
| | $I_{31}$ | $I_{32}$ | $I_{33}$ | $I_{34}$ | $I_{35}$ |
| | $I_{41}$ | $I_{42}$ | $I_{43}$ | $I_{44}$ | $I_{45}$ |
| 5th LINE | $I_{51}$ | $I_{52}$ | $I_{53}$ | $I_{54}$ | $I_{55}$ |

DIGITAL FILTER FOR FILTERING IMAGE DATA

BACKGROUND OF THE INVENTION

I. Field of the Invention

The present invention relates to a non-cyclic or finite-impulse response (FIR) type digital filter for filtering digital image data II. Description of the Related Art A non-cyclic type digital filter is known in the art as a means for processing digital image data at high speed. Digital filters include one-dimensional digital filters whose filter operation area is many lines times 1 tap, and two-dimensional digital filters whose filter operation area is many lines times many taps In the following example, a two-dimensional digital filter will be described.

A filter constant, which will be multiplied during a filter operation, is preset according to a pixel position within a given filter area In a symmetric, non-cyclic type digital filter, filter constants corresponding to pixel position symmetric about the center of an image are set to the same value.

FIG. 8 shows a filter constant correspondence table for a filter operation area of 5 lines×5 taps. In the figure, reference characters a to f designate respective filter constants. Filter constants having the same values are given to positions symmetric about the center of the image.

FIG. 9 shows an example of image data within a filter operation area of 5 lines×5 taps. Each image data is multiplied by a corresponding filter constant shown in FIG. 8 (e.g., image data $I_{11}$ is multiplied by a, $I_{12}$ by b, . . .) and these products are added to provide a filter output.

A conventional, symmetric, non-cyclic type, two-dimensional digital filter is shown in FIG. 2. Referring to FIG. 2, reference numeral 1 designates an input terminal; 11 to 14, line buffers; 15 to 19, input latches; 20, 21, adders; 31 to 45, matrix latches; 51 to 56, adders; 61 to 66, addition unit latches; 67 to 72, multipliers; 73 to 78, processing unit latches; 79, an addition circuit; 80, an output latch; 81, an output terminal; reference character L designates a latch unit; M, an input processing unit; N, an addition unit; and R, a filter processing unit.

As an example of filter operation, it is assumed that the image data of FIG. 9 are input into terminal 1 of FIG. 2. Starting with the first line data "$I_{11}, I_{12}, I_{13}, I_{14}, I_{15}$," the image data are input sequentially on a line basis. The data are temporarily stored in one line buffer per line and are sequentially updated every time the data of the following line are applied. At the point in time when image data corresponding to the 4th line have been input, line buffer 11 contains image data of the first line; line buffer 12 contains image data of the second line; line buffer 13 contains image data of the third line; and line buffer 14 contains image data of the 4th line.

Upon application of image data corresponding to the fifth line the image data of the respective lines are simultaneously transferred to the input latches 15 to 19. Thereafter, adders 20 and 21 add the image data of symmetric lines within the filter operation area (i.e., lines in symmetric positions such as the first line and the fifth line, and the second line and the 4th line) on a tap basis and the sum is sequentially transferred to the latch unit L. Since the third line has no symmetric line, the value of each tap is simply transferred to the latch unit L without any addition.

The matrix latches 31 to 45 latch the sequentially transferred values. Reference characters A to F marked within the respective blocks of the matrix latches 31 to 45 indicate that the image data to be multiplied by the respective filter constants a to f are loaded when all the image data in the 5×5 filter area of (see FIG. 9) have been transferred to the latch unit L.

The addition unit N adds respective pairs of image data which will be multiplied by a common filter constant. For example, adder 51 adds the image data which will be multiplied by the filter constant a. Accordingly, adder 51 is wired to add the values of matrix latches 31 and 35. Following this addition operation, respective addition unit sums are latched by the addition unit latches 61 to 66.

At the filter processing unit R, the addition unit sums are multiplied by respective filter constants a to f using the multipliers 67 to 72. The products are latched by the processing unit latches 73 to 78 and then added by the addition circuit 79. The addition circuit sum (final sum) is latched by an output latch 80 and is then taken out from the output terminal 81 as a filter output.

Since this final sum is the filter output for the image data input at the terminal 1, the output must be data having the same format as the input image data. Image data is generally represented in "integer" form. Accordingly, the digital filter's output must also be in integer form and have the same number of bits as the input image data applied to the terminal 1. For example, if the image data applied to the terminal 1 has 8 bits, then the corresponding filter output must have the same 8 bit format. Therefore, even if the final sum obtained at the addition circuit 79 is a value other than 8 bits, such as a final sum including a decimal fraction, only the 8 bits constituting the integer portion (bits placed at the left of the decimal point) are taken out as an output.

Conventional digital filters are further disclosed in Japanese Patent Application No. 63-50101 and No. 63-95345.

Conventional digital filters typically have respective filter constants with fixed decimal point formats. As such, conventional digital filters are limited to certain pre-defined filter operations. For example, if a digital filter having the decimal point format set for a high-pass filter operation is used as a low-pass filter operation, or vice versa, the output of the digital filter is so inaccurate that it is useless.

Problems associated with conventional digital filters can be illustrated by considering a case where the filter constant decimal point format is set for a high-pass filter operation. The number of digits used to represent a filter constant is allocated at the time the device is designed. In order to determine where the decimal point should be placed within a given set of digits it is necessary to consider to the size of the filter constant which will be used during filter operation.

Since the high-pass filter operation will emphasize the middle portion of the image data, a set of filter constants will be selected in which the value of filter constant f is the largest since the area corresponding to f is at the center of the image area shown in FIG. 8. Since the sum of all the filter constants must be 1, the other filter constants will be negative or less than the value selected for f.

Therefore, a digital filter to be used in a high-pass filter operation requires a format in which the decimal point be placed such that a larger number of digits (the number of bits in binary system) will be allocated to the left of the decimal point to represent a large value for f.

FIG. 3 is a diagram showing a filter operation using filter constants represented to 2 decimal places. Reference character A designates image data to be multiplied by the respective filter constants. Assuming, for example, that 8-bit image data is input, the addition at the addition unit N following the operation at the input processing unit M in FIG. 1 would increase the number of bits of the input data. In this example, the increased number of bits will be assumed to be 11. Reference character B designates a filter constant. The header bit S is a sign bit for identifying whether the filter constant is positive or negative. A sign bit value of 0 positive, while a sign bit value of 1, means that the filter constant is negative. Reference character P designates the decimal point. Five digits at the left of the decimal point allow a large value for f to be represented.

In FIG. 3, reference character C designates the product of the above-described values A and B (the products obtained by the multipliers 67 to 72 in FIG. 2). The decimal point P is placed in the same position as in the filter constant B. Since this is a multiplication of 11 bits and 8 bits, the number of calculated bits (digits) of the whole product is, in theory, 19 bits including those bits indicated by the broken line. However, the number of bits of the digital filter's output (filtered image data) must coincide with the number of bits of the input image data (e.g., 8 bits). Therefore, an operation which cuts the calculated bits down to a number of bits sufficient to represent the digital filter's required output formal must be added to the series of filter operations. FIG. 3 shows a case where the number of bits are cut to 16.

Reference character D in FIG. 3 designates a digital filter output format to be obtained from the output terminal 81 of FIG. 2. Assuming that the data applied to terminal 1 in FIG. 2 is image data and that the image data is expressed in integer form, the digital filter must output a format in the form of an integer having the same number of bits as the input image data. In other words, the result of the digital filter operation including all multiplication and addition operations must be subjected to an additional operation which retrieves a number of bits from the calculated bits corresponding to an integer portion of the calculated bits in a format identical to that of the input image data.

Problems with conventional digital filters can be further illustrated by considering a case where the filter constant decimal point format is set for a low-pass filter operation. In such cases, the filter constant f is set to a small value (e.g., 0.7) and other filter constants are likewise set to values having some decimal fraction. When a digital filter having such filter constants is used with data configured as shown in FIG. 3, only 2 decimal places to the right of point P will remain following any operation. Any further decimal places to the right of P will be dropped from the resulting calculated bits. Such operations with such filter constants produce inaccurate results.

A primary application of low-pass filter operation to image data processing is the production of a smooth image. To this end, each filter constant must usually be as small as the calculated data being represented. Therefore, in a digital filter used in a low-pass filter operation, the decimal point is placed such that the filter constants can be represented by as many decimal places to the right of point P as are required to ensure the accuracy of their representation.

For example, FIG. 4 is a diagram of calculated data showing the filter operation using such filter constants as are required to represent such data to an accuracy of 7 decimal places. Reference characters A to D, S, and P correspond to those in FIG. 3. In each filter constant there is only a sign bit at the left of the decimal point, while there are 7 digits allocated at the right thereof so that a small value can be represented with a high degree of accuracy. Thus, the low-pass filter operation can be performed accurately.

However, if a digital filter with preset low-pass filter constants were applied to a high-pass filter operation in which the filter constant f requires a large value, the value of f could not be accurately represented due to lack of digits allocated at the left of the decimal point. As a result, the high-pass filter operation could not be accurately performed.

As described above, a conventional digital filter with a fixed decimal point format for the respective filter constants is limited as to the type of filter operation or processing that the digital filter can accurately perform.

SUMMARY OF THE INVENTION

An object of the present invention is to overcome the above stated problems. Additional objects and advantages of the invention will be set forth in part in the description which follows and in part will be obvious from the description, or may be learned by practice of the invention. The objects and advantages of the invention may be realized and attained by means of the instrumentalities and combinations particularly pointed out in the appended claims.

To achieve the objects and in accordance with the purpose of the invention, as embodied and broadly described herein, the digital filter of this invention comprises: input means for receiving digital image data having a predetermined format; processing means for calculating a corresponding binary value of the received digital image data, wherein the processing means employs a plurality of digital filter constants having different values, the different values being expressed in a common selected binary format; selecting means for selecting the respective different values for the digital filter constants and for selecting the common binary format for the digital filter constants; and, output selection means for selecting a desired portion of the corresponding binary value, wherein the desired portion is determined by the selected common binary format for the digital filter constants, and for expressing the desired portion in the predetermined digital image data format.

BRIEF DESCRIPTION OF THE DRAWINGS

FIGS. 6(A) through 6(C) are diagrams for explaining how to give a filter constant in the second embodiment;

FIGS. 7(A) through 7(E) are diagrams for explaining the operation to be performed when the effective values represented in bits at the right of the decimal point of a filter constant is outside the bits allocated to represent the filter constant;

FIG. 8 is a diagram indicating a filter constant correspondence table in a filter operation area of 5 lines×5 taps;

FIG. 9 is a diagram indicating an example of image data for a filter operation area of 5 taps×5 lines;

DESCRIPTION OF THE PREFERRED EMBODIMENT

Embodiments of the present invention will be described with reference to the drawings.

Figure 1:
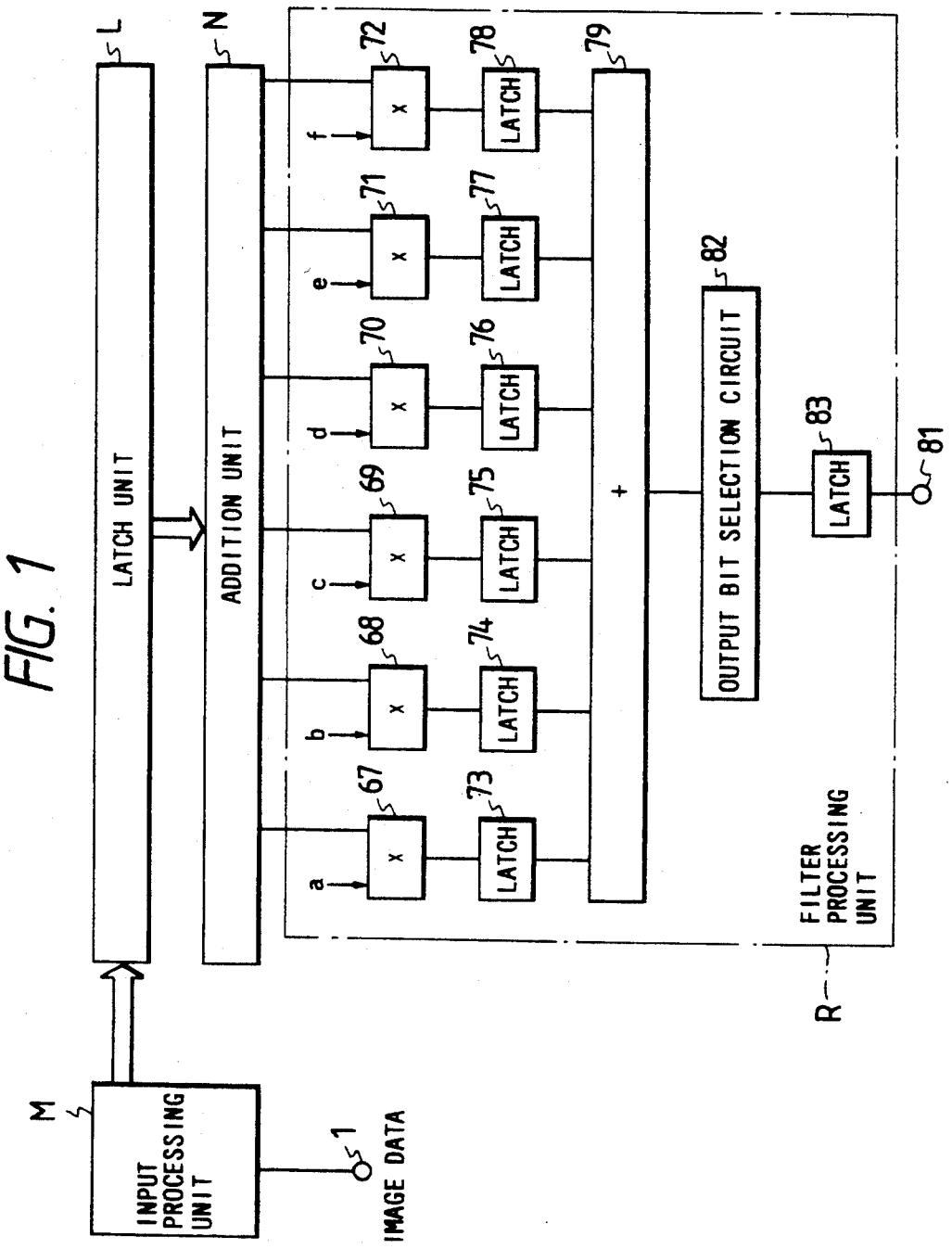
FIG. 1 is a block diagram showing a digital filter which is a first embodiment of the present invention.
Figure 2:
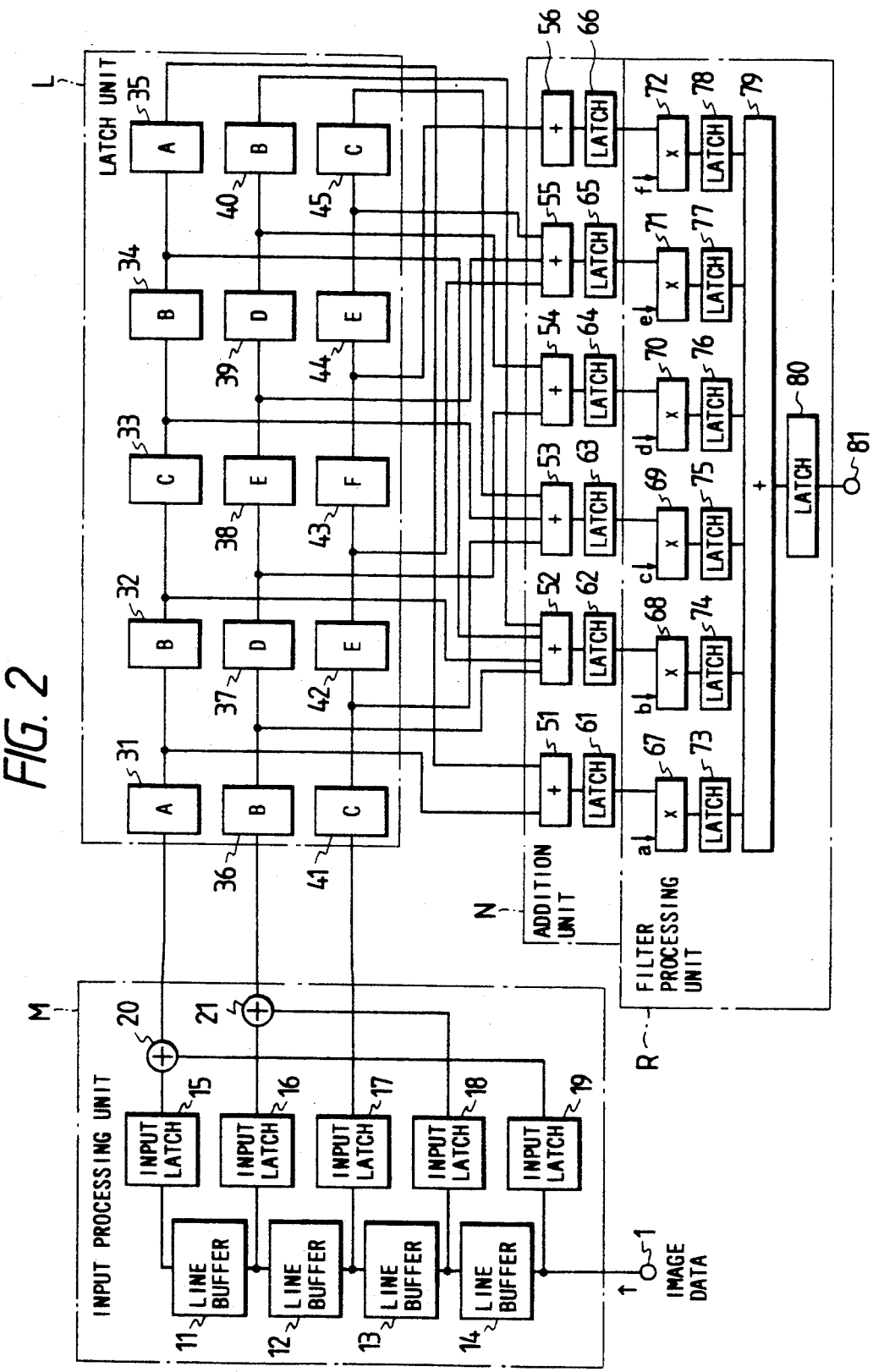
FIG. 2 is a block diagram showing a conventional two-dimensional digital filter.

FIG. 1 shows a digital filter which is a first embodiment of the present invention. Reference numerals and characters correspond to those of FIG. 2, and reference numeral 82 designates an output bit selection circuit; and 83, an output latch.

The output bit selection circuit 82 is a circuit capable of selecting and determining which portion of the calculated bits of the addition circuit 79 should be adopted as a filter output.

As previously explained, in a conventional digital filter, not only is the position of the decimal point of a filter constant fixed, but also the portion of the calculated bits of the addition circuit 79 to be retrieved as a filter output is preset, thereby providing no opportunity in selecting such a portion.

In the present invention, the decimal point in a given filter constant is not fixed but may be arbitrarily selected such that various types of filter operations (a low-pass filter operation, a high-pass filter operation, etc.) can be performed. The position of decimal point is selected such that the value of a filter constant to be used in a filter operation can be represented as accurately as possible.

In retrieving a filter output, a predetermined portion of bits is selectively retrieved from among the calculated bits according to the decimal point thus determined.

Figure 3:
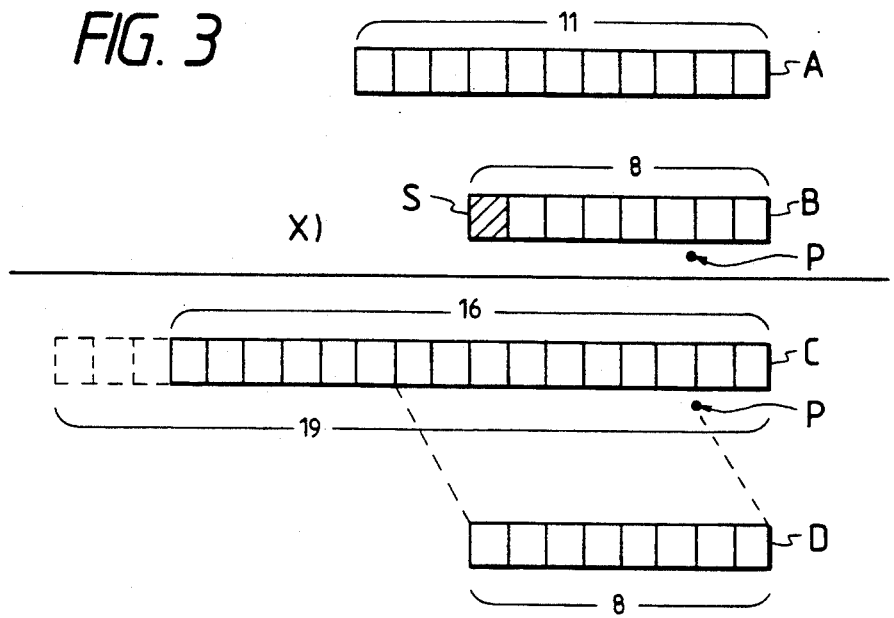
FIG. 3 is an explanatory diagram showing a filter operation using filter constants with the decimal point positioned so that they can be expressed to 2 decimal places.
Figure 4:
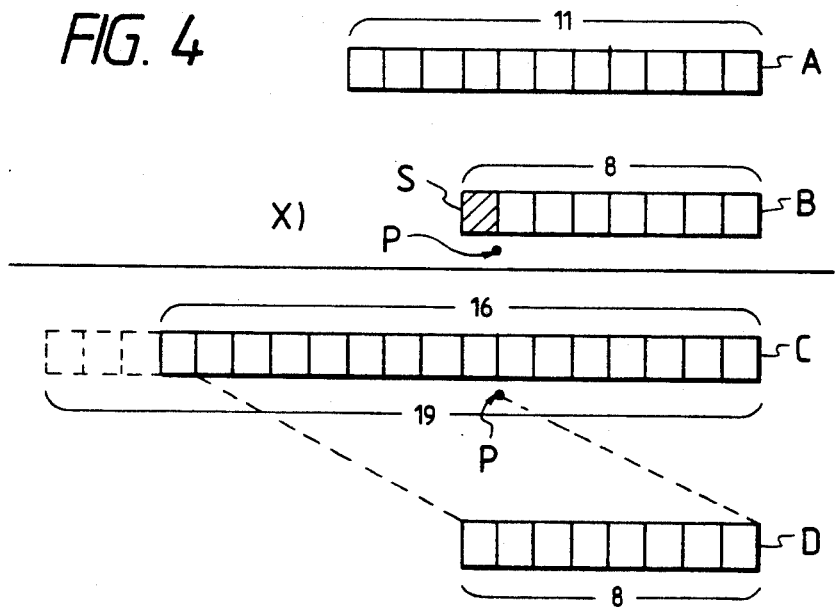
FIG. 4 is an explanatory diagram showing a filter operation using filter constants with the decimal point positioned so that they can be expressed with 7 decimal places.

For example, when a filter operation is performed with filter constants selected by placing the decimal point between the second and third bits, as shown in FIG. 3, a select signal, described later with reference to FIG. 10, specified according to the position of the decimal point is transmitted to the output bit selecting circuit 82. Based on this signal, the output bit selecting circuit 82 operates such that a portion of the calculated bits between the third to tenth bits will be selected. On the other hand, when a filter operation is performed with filter constants selected by placing the decimal point between the 7th and 8th bits as shown in FIG. 4, the output bit selecting circuit 82 operates such that a portion of the calculated bits between the eighth to fifteenth bits will be selected. Accordingly, the digital filter can be operated with satisfactory accuracy not only as a high-pass filter, but also as a low-pass filter.

Figure 10:
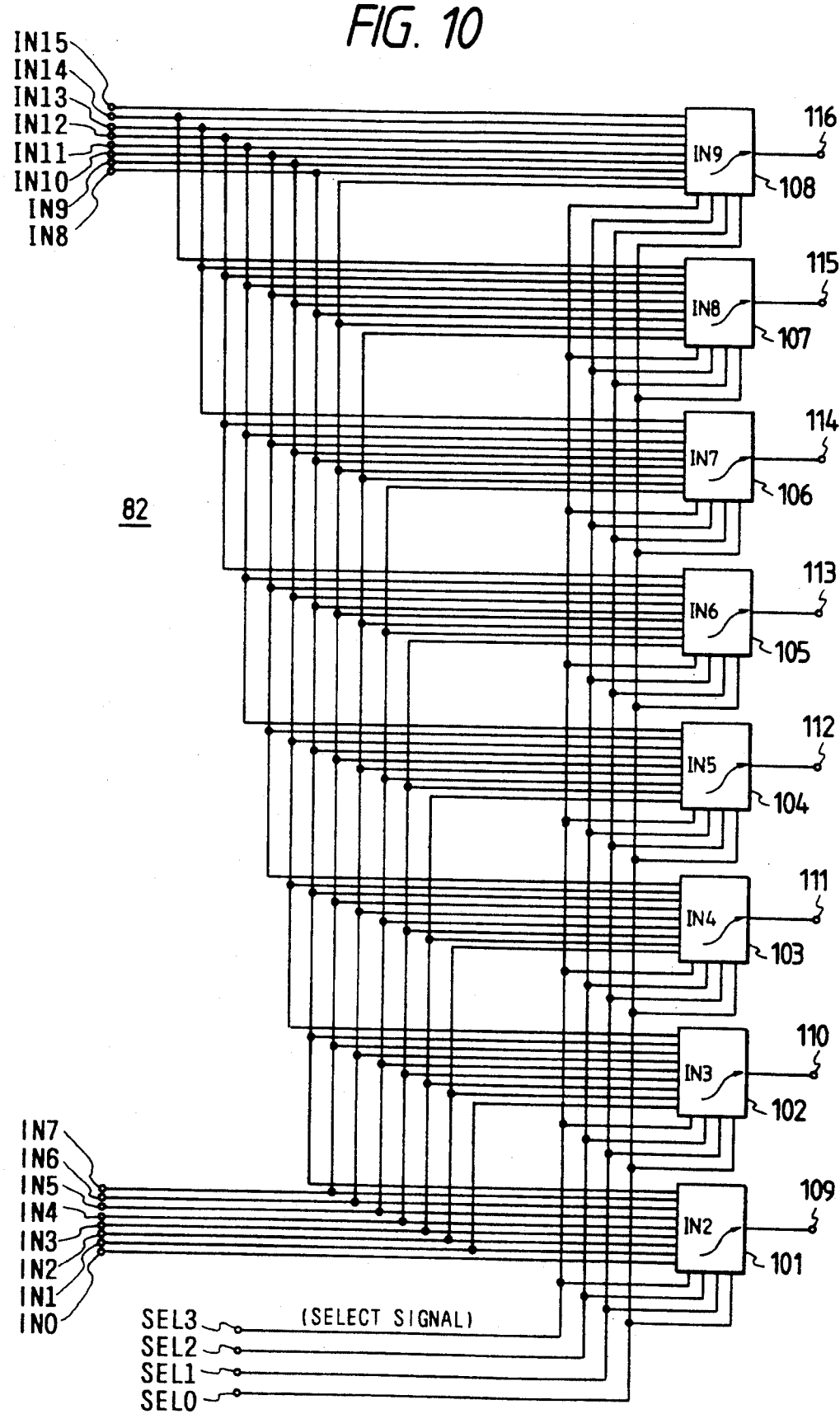
FIG. 10 is a diagram showing the detailed configuration of an output bit selection circuit.

FIG. 10 shows a detailed arrangement of the output bit selecting circuit. Referring to the FIG. 10, reference numerals 101 to 108 designate multiplexers; 109 to 116, output terminals; IN0 to IN15, inputs from the addition circuit 79 of FIG. 1; SEL0 to SEL3, select signals serving to select which portion of bits from among the input bits to be retrieved as an output.

In the above example, it is assumed that the input from the addition circuit 79 consists of 16 bits (thus, there are 16 Ins designated 0 to 15) and an 8-bit portion is to be retrieved as a digital filter output (thus, there are 8 multiplexers).

The multiplexer 101 serves to feed the least significant bit (LSB) of a digital filter output and it contains 9 inputs. That is, these 9 inputs are candidates of the LSB of a digital filter output.

The 8 bits from the most significant bit (MSB) are those counted from the start bit, and its LSB is the 9th bit counted from the LSB of the 16 bits. The 8 bits from the LSB are those placed at the left of the LSB of the 16 bits, and its LSB coincides with the LSB of the 16 bits.

The above described sets of 8 bits are taken up from both ends of the 16 bits. If a set of 8 bits is taken up by shifting the bits between the LSB of the above two sets bit by bit, 7 such sets can be taken. Therefore, adding the 2 sets in both ends, a total of 9 sets of 8 bits are retrieved.

This means that there are 9 LSB candidates of a filter output and it is these 9 candidates that are contained in multiplexer 101. One of these candidates is selected to be the output of the LSB of the digital filter output.

Similarly, multiplexers 102 to 108 select one of 9 inputs and designate the selected input as the output of the second to 8th bits from the LSB, respectively.

Multiplexers 101 to 108 must identify 9 different bits that they respectively contain, so that they require 4 bits, SEL0 to SEL3, as their select signal.

An operation of the output bit selection circuit 82 will be described in detail taking the data format shown in FIG. 3 as an example.

In the case where the decimal point is placed between the second and third digits from the LSB as shown in FIG. 3, a select signal (e.g., 0, 0, 1, 1) determined according to the position of decimal point will be fed. Each multiplexer then selects and outputs the third input from the bottom as described in each respective input block. For example, multiplexer 101 selects and outputs IN2. This becomes the LSB of the digital filter output. As a result, 8 bits made up of IN2 through IN9 are retrieved as the digital filter output.

When the position of the decimal point is changed to the data format shown in FIG. 4, a select signal (e.g., 1, 0, 0, 0) is produced such that multiplexer 101 will select IN7.

The first embodiment of the present invention provides a single digital filter capable of accurately handling different types of filter operations by using sets of filter constants whose decimal points are selectively positioned, (e.g., a set of filter constants expressed to 3 decimal places, or a set of filter constants expressed to 5 decimal places). As a result, the decimal point of a "set" of filter constants, such as a to f shown in FIG. 8, to be used at the same time must be positioned at the same place.

However, for some individual filter constants, the "set" decimal point fails to express their desired value as accurately as they otherwise could because insufficient digits have been allocation to one or the other side of the decimal point. As a result, the accuracy of the filter operation may in some cases remain impaired. If the position of decimal point is variable depending on the respective filter constant selected and the value of the filter constant can be expressed as desired, then the accuracy of the filter operation can be further enhanced.

The second embodiment adds to the first embodiment means for performing a filter operation with respective filter constants selected by individually placed each of whose decimal points. Accordingly, filter operations based on accurately expressed filter constant values can be performed.

Figure 5:
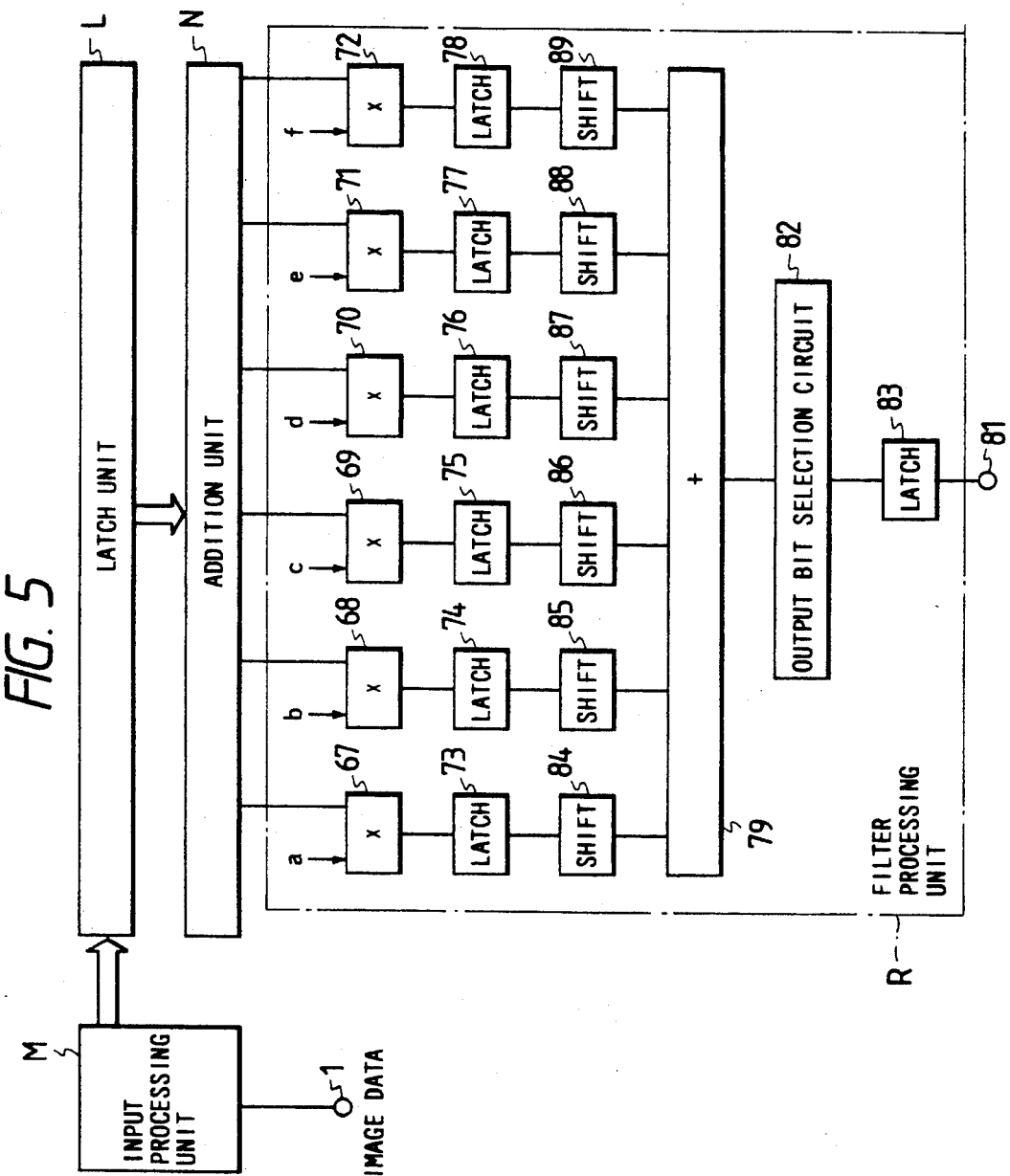
FIG. 5 is a block diagram showing a digital filter which is a second embodiment of the present invention.

FIG. 5 shows a digital filter according to the second embodiment. Reference numerals correspond to those of FIG. 1. Reference numerals 84 to 89 designate shift circuits. The second embodiment differs from the first embodiment in terms of construction; i.e., the shift circuits for shifting the decimal point of each product are provided before the addition circuit 79.

As in the first embodiment, a decimal point position is selected which is most suitable in representing each filter constant by allocating a limited number of the available bits upon consideration of the entire set of filter constants to be used. As an illustrative, it will be assumed that 8 bits can be used to express a filter constant, and that the decimal point placed between the second and third digits from the LSB. This decimal point position is termed as "reference decimal point position" for explanatory purposes. The select signal to be sent to the output bit selection circuit 82 will be a signal corresponding to the reference decimal point position as in the first embodiment.

No problem would exist as long as a single reference decimal point position would allow all the filter constants to be faithfully represented. However, a selected reference decimal point position may not provide the numerical range necessary to express all the desired values of filter constants in some types of filter operations.

The second embodiment overcomes this problem by assigning each respective filter constant a value which allows the filter operation to be accurately performed.

FIGS. 6(A) through 6(C) are diagrams illustrating how a filter constant is assigned in the second embodiment of the present invention. Reference character "S" designates a sign bit; and P, the decimal point. Assuming that a filter constant consists of 8 bits and that filter constants b to f can be accurately expressed with representation to 2 decimal places, the reference decimal point position is set between the second and third digits.

If filter constant a, shown in FIG. 6(A), is a value whose effective value starts at the third decimal place, to the right of P the filter constant a will nonetheless be expressed in a format shown in FIG. 6(B) when expressed according to the reference decimal point position. Since there are only 2 bits at the right of the decimal point, it is not possible to express the desired value of the filter constant a. The filter processing will, therefore, be completed with a filter constant being zero unless some kind of additional processing is performed.

A reference decimal point position which uses 7 decimal places to the right of P would accurately express the desired value of filter constant a. However, such an arrangement does not work when another filter constant (e.g., filter constant b) is expressed to a larger number of decimal places.

In such a case, the second embodiment accommodates the filter constant a shown in FIG. 6(A) in 8 bits allocated to represent the filter constant (hereinafter referred to as "8 constant bits") with the decimal point position shifted to a different position. For example, as shown in FIG. 6(C), the decimal point is placed immediately after the starting sign bit, and the effective value shown in FIG. 6(A) is expressed within the 8 constant bits. That is, the decimal point is shifted 5 bits further to the left of the reference decimal point.

Filter constant a is subjected to a multiplication with image data by a multiplier. As far as its product is concerned, the decimal point is shifted to the reference decimal point place. Thus, the product obtained with the filter constant allocated as shown in FIG. 6(C) is, as a result, shifted 5 bits further to the right. The shift operation is performed by shift circuits 84 to 89.

There are still other filter constants which cannot be represented only by shifting the decimal point position within the 8 constant bits. Some filter constants, which are very small, have their effective values appear at a position outside the 8 constant bits even if expressed to as many decimal places as possible within a limit. In order to enhance the accuracy of the filter operation, such filter values must also be taken into full account in the processing. FIGS. 7(A) through 7(E) are diagrams which illustrate the operation in such a case.

FIG. 7(A) is an example of such a filter constant, whose effective value appears to as low as 13 decimal places. FIG. 7(B) shows the 8 constant bits, whose reference decimal point position comes, it is assumed, immediately after the sign bit S.

Attempts to express the filter constant shown in FIG. 7(A) with the reference decimal point positioned as such do not permit its effective value to be represented because such a reference decimal point position allocates only 7 digits at the right of the decimal point. In this case, a set of 8 bits including the effective value such as shown in FIG. 7(C) is input as a filter constant, and the decimal point of the product obtained with that filter constant is placed at the same position as that in FIG. 7(A). Such a product is shown in FIG. 7(D). The product is processed so that it can be represented in a total of 16 bits. Any bits outside the 16 bits have been trimmed.

Assume that the number of bits representing image data to be multiplied by the filter constant is 11, and that the effective value 1 of the filter constant influences a portion at the right of the 11th digit from the LSB of the product (e.g., the bit dotted in FIG. 7(D)).

The circuit in FIG. 5 shifts the product thus obtained so that the number of bits at the right of the decimal point will be the same as with the reference decimal point shown in FIG. 7(B) (i.e., the decimal point is positioned between the 7th and the 8th bits from the LSB). FIG. 7(E) shows the product whose decimal point being shifted as such.

Any values at the left of the bit so to which the sign bit has been shifted are made equal to that sign bit so that the sign, positive or negative, of the product will not be changed by the shift operation. For example, in the case where bit S in FIG. 7(D) is set to "1" indicating a negative value, any bits at the right of bit So in FIG. 7(E) will be set to "1."

Figure 11:
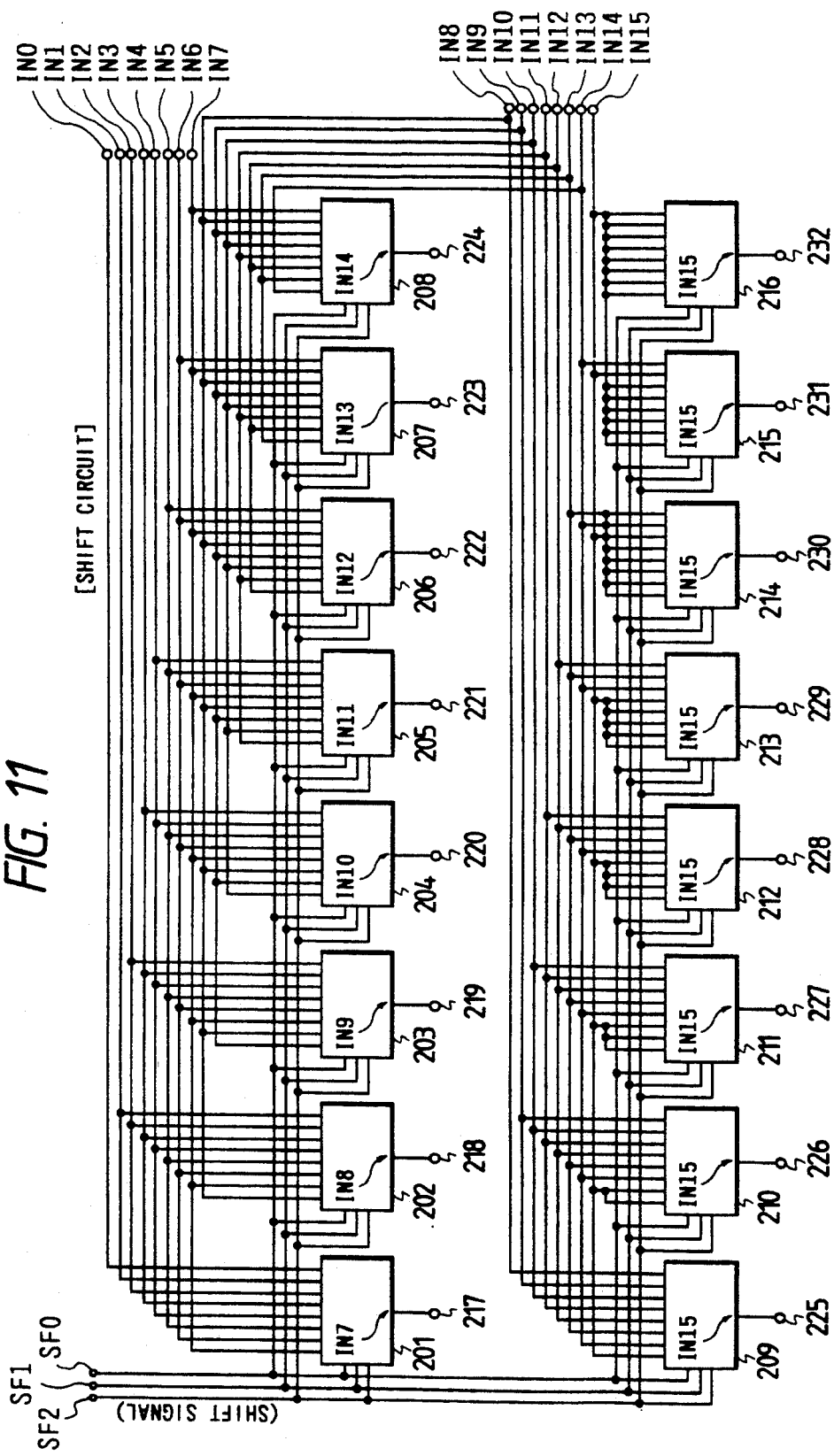
FIG. 11 is a diagram showing a specific example of a set of shift circuits.

FIG. 11 shows a specific example of shift circuits. In this example, a shift operation of up to 7 bits can be performed. Reference numerals 201 to 216 designate multiplexers; 217 to 232, output terminals; SF0 to SF2, a 3-bit shift signal; and IN0 to IN15, input bits from the processing unit latch circuits.

Since the input from the processing unit latches is represented in 16 bits in this example, there are 16 bits from IN0 to IN15 (corresponding to, e.g., bits from the LSB to the MSB in FIG. 7(D)).

Each multiplexer generates the bit that has been shifted. In order for a maximum of 7 bits to be shifted, an input must consists of a set of 8 continuous bits. To this end, each multiplexer has 8 inputs.

When all the multiplexers select the rightmost inputs from among 8 inputs, respectively, the output of the shift circuits consists of bits IN0 to IN15, the same as their input. In this case, no bits have, in fact, been shifted.

When all the multiplexers select the second inputs from the rightmost, respectively, the output in which the bits applied to the shift circuits have been shifted one bit further to the left. Thereafter, the further the multiplexers select their inputs to the left, the larger the shift amount becomes. When the leftmost inputs are selected, the output having the input shifted only 7 bits can be obtained. The input such as IN7 marked in the block of a multiplexer designates an input to be selected at the time the 7-bit shift will be performed.

Since one input is selected out of 8, the shift signal must be able to identify at least 8 different source signals. Thus, it consists of 3 bits from SF0 to SF2.

Although each of the multiplexers 210 to 216 has its start bit (sign bit), IN15, applied to a plurality of input terminals, this is to make any bits at the left of the bit So obtained by shifting the sign bit equal to that sign bit, as shaded in FIG. 7(E).

As a result of the above shift operation, when the shifted output is to be fed to the addition circuit 79, their decimal point is set to the reference decimal point position. Such an output is added and have their output bits selected by the output bit selection circuit 82 based on a select signal corresponding to the reference decimal point position.

As described in the foregoing pages, the present invention provides a digital filter capable of obtaining a filter output by adding the products of image data in a filter operation area with a set of desired filter constants, selecting a predetermined portion among the calculated bits with the output bit selection circuit, and expressing the result retrieved according to the decimal point format of the filter constants. A digital filter according to the present invention provides the following advantages:

A single digital filter capable of performing different types of filter operations such as a low-pass filter operation and a high-pass filter operation accurately; and If a shift circuit is added which allows the decimal point position to be shifted with every multiplication according to the respective filter constant value, a filter operation making the most of the effective values of each filter constant can be performed, which will enable filter operations to be further improved.

What is claimed is:

1. A digital filter for filtering digital image data, comprising:

input means for receiving digital image data having a predetermined format;

means for establishing a plurality of digital filter constants having different values, said different values being expressed in a selected common binary format;

processing means employing said digital filter constants for calculating a corresponding binary value of the received digital image data;

selecting means for selecting a respective different value for each one of the plurality of digital filter constants and for selecting the common binary format for the digital filter constants; and output selection means for selecting a desired portion of said corresponding binary value, wherein said desired portion is determined by the selected common binary format for the digital filter constants, and for expressing said desired portion in the predetermined digital image data format.

2. A digital filter for filtering digital image data, comprising:

selecting means for selecting values for a plurality of digital filter constants, said values being expressed in a common binary format, and for selecting said common binary format for the plurality of digital filter constants;

input means for sequentially receiving and storing lines of digital image data having a predetermined format and for adding respective pairs of said lines to obtain resulting line values, wherein said respective pairs are symmetrically disposed about the center of a digital image;

latching means for receiving said resulting line values and for storing said resulting line values as elements within a line value image data matrix;

first addition means for obtaining sums of selected elements of the line value image data matrix and for storing the respective sums as addition values;

processing means for receiving the addition values, for multiplying each one of said addition values by a corresponding one of said plurality of filter constants to obtain multiplication products, and for storing the multiplication products as multiplication values;

second addition means for adding said multiplication values to obtain a final sum value; and output selection means for selecting a desired portion of the final sum value, wherein said desired portion is determined by the common binary format of the plurality of filter constants, and for providing said desired portion as an output, wherein said output has the predetermined digital image data format.

3. An apparatus according to claim 2, wherein said output selection means comprises:

a plurality of multiplexers corresponding to the number of bits in the predetermined digital image data format, each one of said plurality of multiplexers having multiple inputs from the second addition means, wherein each one of said plurality of multiplexers selects one of said multiple inputs according to the common binary format for the plurality of filter constants.

* * * * *